United States Patent
Kim et al.

(10) Patent No.: US 11,430,936 B2
(45) Date of Patent: Aug. 30, 2022

(54) THERMOELECTRIC MODULE

(71) Applicant: LG CHEM, LTD., Seoul (KR)

(72) Inventors: Jae Hyun Kim, Daejeon (KR); Cheol Hee Park, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 16/642,576

(22) PCT Filed: Aug. 14, 2019

(86) PCT No.: PCT/KR2019/010376
§ 371 (c)(1),
(2) Date: Feb. 27, 2020

(87) PCT Pub. No.: WO2020/040479
PCT Pub. Date: Feb. 27, 2020

(65) Prior Publication Data
US 2020/0266328 A1    Aug. 20, 2020

(30) Foreign Application Priority Data

Aug. 21, 2018 (KR) .................... 10-2018-0097692

(51) Int. Cl.
*H01L 35/32* (2006.01)
*H01L 35/10* (2006.01)
*H01L 35/04* (2006.01)

(52) U.S. Cl.
CPC .............. *H01L 35/32* (2013.01); *H01L 35/04* (2013.01); *H01L 35/10* (2013.01)

(58) Field of Classification Search
CPC .......... H01L 35/04; H01L 35/10; H01L 35/32
See application file for complete search history.

(56) References Cited

U.S. PATENT DOCUMENTS

| 8,216,871 B2 * | 7/2012 | McCann | ............... H01L 35/08 438/54 |
| 2001/0000577 A1 | 5/2001 | Parise | |

(Continued)

FOREIGN PATENT DOCUMENTS

| EP | 2323187 A1 | 5/2011 |
| JP | 6-69550 A | 3/1994 |

(Continued)

OTHER PUBLICATIONS

Extended European Search Report for European Application No. 19845898.6, dated Aug. 21, 2020.

*Primary Examiner* — Tamir Ayad
(74) *Attorney, Agent, or Firm* — Birch, Stewart, Kolasch & Birch, LLP

(57) ABSTRACT

The present invention relates to a thermoelectric module, and a thermoelectric module according to an exemplary embodiment of the present invention includes: a plurality of thermoelectric elements that are disposed between a heat transmission member and a cooling member; and a first electrode layer and a second electrode layer that are respectively disposed between the heat transmission member and the plurality of thermoelectric elements and between the cooling member and the plurality of thermoelectric elements, wherein the plurality of thermoelectric elements may include P-type thermoelectric elements and N-type thermoelectric elements, and a P-type thermoelectric element and an N-type thermoelectric element that neighbor each other may have different heights, and one electrode layer selected from among the first electrode layer and the second electrode layer formed throughout the P-type thermoelectric element and the N-type thermoelectric element that neighbor each other may have at least two bent portions.

9 Claims, 12 Drawing Sheets

(56) References Cited

U.S. PATENT DOCUMENTS

| | | |
|---|---|---|
| 2002/0139123 A1 | 10/2002 | Bell |
| 2004/0231714 A1 | 11/2004 | Stark et al. |
| 2005/0139249 A1* | 6/2005 | Ueki ................ H01L 35/34 |
| | | 136/211 |
| 2006/0151021 A1 | 7/2006 | Stark |
| 2010/0218796 A1 | 9/2010 | Hiroyama |
| 2010/0288325 A1 | 11/2010 | Takahashi |
| 2011/0030389 A1 | 2/2011 | Morisaku et al. |
| 2011/0139204 A1 | 6/2011 | Sahin et al. |
| 2011/0139206 A1* | 6/2011 | Ukita ................ H01L 35/06 |
| | | 136/224 |
| 2012/0174955 A1 | 7/2012 | Hwang et al. |
| 2014/0137918 A1 | 5/2014 | Zirkle et al. |
| 2014/0209140 A1* | 7/2014 | Funahashi ........... H01L 35/32 |
| | | 136/205 |
| 2016/0056360 A1 | 2/2016 | Cho et al. |
| 2017/0098751 A1 | 4/2017 | Noh et al. |
| 2017/0288117 A1 | 10/2017 | Song et al. |
| 2018/0294397 A1 | 10/2018 | Suzuki et al. |
| 2019/0226923 A1 | 7/2019 | Harada et al. |

FOREIGN PATENT DOCUMENTS

| | | |
|---|---|---|
| JP | 6-310765 A | 11/1994 |
| JP | 7-321379 A | 12/1995 |
| JP | 2000-286462 A | 10/2000 |
| JP | 2003-234515 A | 8/2003 |
| JP | 2004-526930 A | 9/2004 |
| JP | 2007-500951 A | 1/2007 |
| JP | 2009-81286 A | 4/2009 |
| JP | 2009-99686 A | 5/2009 |
| JP | 2009-526401 A | 7/2009 |
| JP | 2011-35305 A | 2/2011 |
| JP | 2012-195441 A | 10/2012 |
| JP | 2015-115590 A | 6/2015 |
| JP | 2016-503642 A | 2/2016 |
| JP | 2016-174114 A | 9/2016 |
| JP | 2017-34135 A | 2/2017 |
| JP | 2017-135278 A | 8/2017 |
| JP | 2017-188574 A | 10/2017 |
| JP | 2018-13471 A | 1/2018 |
| KR | 10-2008-0048573 A | 6/2008 |
| KR | 10-2012-0016357 A | 2/2012 |
| KR | 10-2013-0028035 A | 3/2013 |
| KR | 10-1493797 B1 | 2/2015 |
| KR | 10-2017-0041080 A | 4/2017 |
| KR | 10-2017-0111840 A | 10/2017 |
| WO | WO 03/105244 A1 | 12/2003 |
| WO | WO 2011/019077 A1 | 2/2011 |
| WO | WO 2011/044115 A2 | 4/2011 |
| WO | WO 2012/140652 A1 | 10/2012 |
| WO | WO 2017/066261 A3 | 4/2017 |
| WO | WO 2017/110589 A1 | 6/2017 |

* cited by examiner

THERMOELECTRIC MODULE

CROSS-REFERENCE TO RELATED APPLICATION(S)

This application claims priority to and the benefit of Korean Patent Application No. 10-2018-0097692 filed in the Korean Intellectual Property Office on Aug. 21, 2018, the entire contents of which are incorporated herein by reference.

TECHNICAL FIELD

The present invention relates to a thermoelectric module, and more particularly, it relates to a thermoelectric module that can improve power generation efficiency and high temperature reliability.

BACKGROUND ART

A thermoelectric element is an element used to directly convert heat energy to electrical energy or electrical energy to heat energy by utilizing a material having a thermoelectric characteristic, and is a technology that corresponds to the needs of the times of energy saving. This has been widely utilized in overall industry such as automotive, aerospace, semiconductor, bio, optical, computer, power generation, and consumer electronics.

Specifically, when a temperature difference occurs at opposite ends of a material, differences in concentration of carriers such as electrons or holes with thermal dependence occur, resulting in thermoelectric phenomena. These thermoelectric phenomena may be classified into thermoelectric power generation to produce electrical energy, and thermoelectric cooling/heating which causes a temperature difference between opposite ends by supplying electricity.

A pair of p-n thermoelectric elements consisting of a P-type thermoelectric element that moves a hole to move heat energy and an N-type thermoelectric element that moves an electron to move heat energy may be a basic unit of the P-type thermoelectric module. In addition, such a thermoelectric module may be provided with an electrode that connects a P-type thermoelectric element and an N-type thermoelectric element. In addition, the thermoelectric module may be provided with a substrate that is disposed outside the thermoelectric element to electrically insulate constituent elements such as an electrode from the outside, and protects the thermoelectric module from external physical or chemical elements.

In general, the height of the P-type thermoelectric element and the height of the N-type thermoelectric element are similarly formed to manufacture the thermoelectric element easily in manufacturing of the thermoelectric module. This is because a high-temperature and high-pressure process is performed during a bonding process between the electrode and the thermoelectric material in the manufacturing process of the thermoelectric element, and it may ease the process by matching the height of the material and the height of the electrode.

However, in such a case, performance deterioration may occur when a P-type thermoelectric element and an N-type thermoelectric element, each having a different level of electrical conductivity, Seebeck characteristic, and thermal conductivity are used together and thus performance of the thermoelectric material cannot be maximized, thereby causing relative performance deterioration of the thermoelectric element.

DISCLOSURE

Technical Problem

The present invention has been made in an effort to provide a thermoelectric module of which a P-type thermoelectric element and an N-type thermoelectric element are different in height according to a characteristic of a thermoelectric element.

However, the problem to be solved by the embodiments of the present invention is not limited to the above-described problem can be variously extended within the scope of the technical idea included in the present invention.

Technical Solution

A thermoelectric module according to an exemplary embodiment of the present invention includes: a heat transmission member, a cooling member, a plurality of thermoelectric elements that are disposed between the heat transmission member and the cooling member; and a first electrode layer, wherein the first electrode layer is disposed between the heat transmission member and the plurality of thermoelectric elements, and a second electrode layer, wherein the second electrode layer is disposed between the cooling member and the plurality of thermoelectric elements, wherein the plurality of thermoelectric elements may include a first P-type thermoelectric element and a first N-type thermoelectric element, the first P-type thermoelectric element being adjacent to the first N-type thermoelectric element, wherein a height of the first P-type thermoelectric element is different than a height of the first N-type thermoelectric element, and wherein the second electrode layer may have at least two bent portions and extend between the first P-type thermoelectric element and the first N-type thermoelectric element.

The second electrode layer may be disposed on an upper surface of the first P-type thermoelectric element and the second electrode layer may also be disposed an upper surface of the first N-type thermoelectric element.

The second electrode layer may have a uniform thickness.

The plurality of thermoelectric elements further comprises a second N-type thermoelectric element, the first electrode layer may extend in (or be formed on) a single plane and the first electrode may be formed on a bottom surface of the second N-type thermoelectric element and on a bottom surface of the first P-type thermoelectric element.

A height of each P-type thermoelectric element may be lower than a height of each N-type thermoelectric element.

The thermoelectric module may further include a first substrate and a second substrate, the first substrate may be disposed outside the plurality of thermoelectric elements at a first side of the plurality of thermoelectric elements and the second substrate may be disposed outside the plurality of thermoelectric elements at a second side of the plurality of thermoelectric elements, the first side of the plurality of thermoelectric elements being opposite to the second side of the plurality of thermoelectric element.

At least one of the first substrate and the second substrate includes alumina.

One substrate selected from among the first substrate and the second substrate may include at least two bent portions corresponding to the electrode layer having the at least two bent portions, such as the second electrode layer.

Each P-type thermoelectric element may have a length in a horizontal direction different than a length in the horizontal direction of each N-type thermoelectric element.

The length of each P-type thermoelectric element may be longer than the length of each N-type thermoelectric element.

The thermoelectric module may further include an insulator, wherein the insulator is bonded to an upper surface of the first N-type thermoelectric element.

The thermoelectric module may further include a dummy metal layer, wherein the dummy layer overlaps the first P-type thermoelectric element.

The thermoelectric module may further include an insulator, wherein the insulator is bonded to an upper surface of the first N-type thermoelectric element and the insulator is bonded to an upper surface of the dummy metal layer.

The dummy metal layer may be disposed below the first P-type thermoelectric element.

The dummy metal layer may include an upper dummy metal layer and a lower dummy metal layer, and wherein the first P-type thermoelectric element is disposed between the upper dummy metal layer and the lower dummy metal layer.

Advantageous Effects

According to the exemplary embodiments, thermoelectric elements, each having a different height in consideration of a characteristic of the thermoelectric element, are formed to thereby maximize performance of the thermoelectric element, and an electrode that electrically connects the P-type thermoelectric element and the N-type thermoelectric electrode has a bend or a bent portion between the P-type thermoelectric element and the N-type thermoelectric element to implement such a thermoelectric element structure such that power generation efficiency of the thermoelectric module can be improved.

MODE FOR INVENTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In addition, unless explicitly described to the contrary, the word "comprise" and variations such as "comprises" or "comprising" will be understood to imply the inclusion of stated elements but not the exclusion of any other elements.

In addition, in this specification, the phrase "on a plane" means viewing a target portion from the top, and the phrase "on a cross-section" means viewing a cross-section formed by vertically cutting a target portion from the side.

Figure 1:
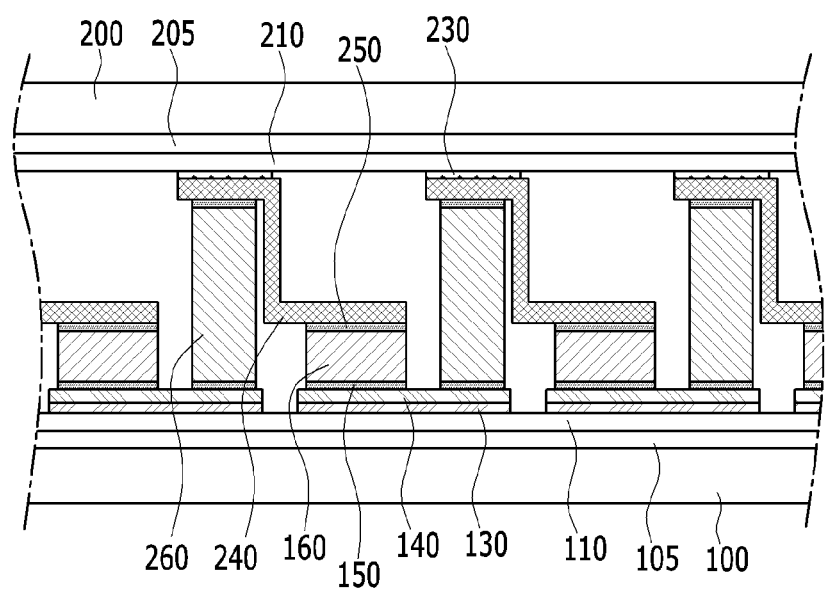
FIG. 1 is a cross-sectional view of a thermoelectric module according to an exemplary embodiment of the present invention.

FIG. 1 is a cross-sectional view of a thermoelectric module according to an exemplary embodiment of the present invention.

Referring to FIG. 1, a thermoelectric module according to an exemplary embodiment of the present invention includes a heat transmission member 100, a cooling member 200 that corresponds to the heat transmission member 100, and a plurality of thermoelectric elements 160 and 260 disposed between the heat transmission member 100 and the cooling member 200. In this case, the thermoelectric elements 160 and 260 may be coated to prevent oxidization of the thermoelectric elements 160 and 260, or the plurality of thermoelectric elements 160 and 260, the heat transmission member 100, and the cooling member 200 may be disposed in a vacuumed structure.

In the present exemplary embodiment, first and second electrode layers 140 and 240 are formed for electric connection of the plurality of thermoelectric elements 160 and 260. Although it is not illustrated, an electric signal may be transmitted through a connection with an external terminal by a module electrode. The thermoelectric module according to the present exemplary embodiment further includes thermal conductive layers 105 and 205 that are disposed at at least one of between the heat transmission member 100 and the thermoelectric elements 160 and 260 and between the cooling member 200 and the thermoelectric elements 160 and 260 such that adhesion between the heat transmission member 100 and the thermoelectric elements 160 and 260 and adhesion between the cooling member 200 and the thermoelectric elements 160 and 260 can be improved, and heat transmission efficiency can be increased.

The thermoelectric module generates electricity by using a temperature difference between the heat transmission member 100 and the cooling member 200, or is cooled or heated by electricity supply. More specifically, the above-described thermal conductive layers 105 and 205 may be disposed between the heat transmission member 100 and a first substrate 110 and between the cooling member 200 and a second substrate 210. The thermal conductive layers 105 and 205 may transmit heat from the heat transmission member 100 to the thermoelectric elements 160 and 260 or radiate heat to the cooling member 200, and at the same time, may mitigate the increase in mounting loads from external impact or vibration and thermal expansion of thermoelectric module constituent elements. The thermal conductive layers 105 and 205 may include at least one of a graphite sheet, thermal grease, and a thermal pad.

A thermoelectric element assembly according to the exemplary embodiment of the present invention includes a first substrate 110, a second substrate 210, a plurality of electrode layers 140 and 240, and a plurality of thermoelectric elements 160 and 260.

The first substrate 110 and the second substrate 210 are formed in the shape of a plate and may have an insulating property, and may protect various elements of the thermoelectric module such as the thermoelectric elements 160 and 260 by being disposed at an outer portion of the thermoelectric element assembly and may maintain the thermoelectric element assembly to be electrically insulated from the outside. The first and second substrates 110 and 210 may be alumina substrates. Instead of the first and second substrates 110 and 210, an insulation layer may be coated.

The first and second electrode layers 140 and 240 are disposed on the first and second substrates 110 and 210, and they are electrically conductive such that a current can flow therethrough. The first and second electrode layers 140 and 240 are formed to expose at least one surface of the first and second substrates 110 and 210, and thus the thermoelectric elements 160 and 260 may be mounted. The at least two thermoelectric elements 160 and 260 may be mounted on the first electrode layer 140 or the second electrode layer 240, and the first electrode layer 140 and the second electrode layer 240 provide a current flow path between the two thermoelectric elements 160 and 260. The first and second electrode layers 140 and 240 may be formed on the top surface of the first substrate 110 and the bottom surface of the second substrate 210 by deposition, sputtering, direct compression, printing, and the like, and the thermoelectric elements 160 and 260 may be disposed between the first electrode layer 140 formed in the first substrate 110 and the second electrode layer 240 formed in the second substrate 210.

The first and second electrode layers 140 and 240 may be formed of a conductive material, and may be formed of, for example, at least one metal selected a group consisting of copper, gold, silver, nickel, aluminum, chromium, tin, indium, zinc, and the like, or an alloy including these metals.

The first and second adhesive layers 130 and 230 may be respectively disposed between the first electrode layer 140 and the first substrate 110 and between the second electrode layer 240 and the second substrate 210 for firm adhesion therebetween. The adhesive layers 130 and 230 may be formed of a metal material such as Pb, Al, Ni, Sn, Cu, Ti, Mo, Al, and Ag, or, an alloy of these metals.

Auxiliary layers 150 and 250 including functional layers such as a diffusion barrier, and material bonding and protective layers, may be disposed between the thermoelectric elements 160 and 260 and the first electrode layer 140 and/or between the thermoelectric elements 160 and 260 and the second electrode layer 240.

The thermoelectric elements 160 and 260 may be formed of a thermoelectric material, that is, a thermoelectric semiconductor. The thermoelectric semiconductor may include various types of thermoelectric materials such as chalcogenide-based, skutterudite-based, silicide-based, citrate-based, and half Heusler-based thermoelectric material. For example, a thermoelectric material such as a BiTe-based material, a PbTe-based material, and the like can be appropriately doped.

The thermoelectric elements 160 and 260 include an N-type thermoelectric element 260 and a P-type thermoelectric element 160, and the N-type thermoelectric element 260 may move a hole to move thermal energy and the P-type thermoelectric element 160 may move an electron to move thermal energy. The thermoelectric elements 160 and 260 may form a basic unit by pairing the N-type thermoelectric element 260 and the P-type thermoelectric element 160. Since at least two or more N-type thermoelectric elements 260 and/or P-type thermoelectric elements 160 are provided, a plurality of pairs may be provided. In addition, the N-type thermoelectric elements 260 and the P-type thermoelectric elements 160 are alternately arranged such that a plurality of N-type thermoelectric element 260-P-type thermoelectric element 260 pairs can be formed.

The N-type thermoelectric element 260 and the P-type thermoelectric element 160 may be electrically connected with each other through the first and second electrode layers 140 and 240. For example, with reference to one first electrode layer 140, the N-type thermoelectric element 260 may be bonded to one end of the first electrode layer 140 and the P-type thermoelectric element 160 may be bonded to the other end of the first electrode layer 140.

According to the present exemplary embodiment, the P-type thermoelectric element 160 and the N-type thermoelectric element 260 have different heights to reduce performance deterioration, which may occur when a P-type thermoelectric element and a N-type thermoelectric element, each having a different level of electrical conductivity, Seebeck characteristic, and thermal conductivity are used together, and improve power generation efficiency of the thermoelectric module. For example, a low height thermoelectric element may have a height of 80% or less of a high height thermoelectric element.

In order to implement such a thermoelectric element, as shown in FIG. 1, an electrode electrically connecting the P-type thermoelectric element and the N-type thermoelectric element in series may have a bend or a bent portion between the P-type thermoelectric element and the N-type thermoelectric element. Specifically, the P-type thermoelectric element 160 is lower than the N-type thermoelectric element 260 in height, and the second electrode layer 240 is continuously formed through the P-type thermoelectric element 160 and the N-type thermoelectric element 260, which neighbor each other, such that the second electrode layer 240 are simultaneously formed on the top end surface of the P-type thermoelectric element 160 and the top end surface of the N-type thermoelectric element 260. The second electrode layer 240 is bent once near a corner of the N-type thermoelectric element 260 due to a height difference at a portion between the top end surface of the N-type thermoelectric element 260 and the top end surface of the P-type thermoelectric element 160, and then may be bent again near a corner of the P-type thermoelectric element 160. In this case, the second electrode layer 240 formed throughout the P-type thermoelectric element 160 and the N-type thermoelectric element 260 that neighbor each other may have a uniform thickness.

On the contrary, the first electrode layer 140 formed at the bottom end surface of the P-type thermoelectric element 160 and the bottom end surface of the N-type thermoelectric element 260 is continuously formed throughout the bottom end surfaces of the P-type thermoelectric element 160 and the N-type thermoelectric element 260 that neighbor each other, and thus the bottom end surface of the P-type thermoelectric element 160 and the bottom end surface of the N-type thermoelectric element 260 have the same height such that the first electrode layer 140 may be formed one on a plane. When the second electrode layer 240 is continuously formed in the direction of the N-type thermoelectric element 260 that neighbors at the left side with reference to the P-type thermoelectric element 160 in FIG. 1, the first electrode layer 140 may be continuously formed in the direction of the N-type thermoelectric element 260 that neighbors at the right side.

When the heights of the P-type and N-type thermoelectric elements are reduced together, total resistance is reduced and an output is significantly increased, thereby increasing a gain of output density. However, in this case, a temperature difference cannot be easily formed, and resultantly thermoelectric element efficiency may be deteriorated. However, according to the present exemplary embodiment, a device design that is advantageous in terms of output density, device efficiency, a material consumption rate, and device price can be implemented by manufacturing the device to increase the heat transfer efficiency by setting heights of the P-type thermoelectric element and the N-type thermoelectric element to be different from each other. Specifically, in case of an N-type thermoelectric material, the electrical conductivity is large, so even if the material is long, the resistance is small, and the thermal conductivity is large such that the N-type thermoelectric material requires a high height for generation of a significant temperature difference. However, in case of a P-type thermoelectric material, the electrical conductivity is small and thus the N-type thermoelectric material needs to be short in height such that a resistance level can be similar to that of the N-type thermoelectric material, total resistance can be advantageously reduced, and a temperature difference for implementation of the thermoelectric characteristic can significantly occur even though the height of the P-type thermoelectric material is short due to small thermal conductivity.

As previously described, considering the characteristics of the P-type thermoelectric element 160 and the N-type thermoelectric element 260, not only is the height of each thermoelectric element formed differently, but also the length of the thermoelectric element is formed differently for maximum output formation. Here, the length implies a length in the horizontal direction, that is, a length that is defined along a direction in which the first electrode layer 140 is formed from the P-type thermoelectric element 160 to the N-type thermoelectric element 260 when the first electrode layer 140 is continuously formed throughout the P-type thermoelectric element 160 and that N-type thermoelectric element 260 that are adjacent to each other. The length of the P-type thermoelectric element 160 may be longer than that of the N-type thermoelectric element 260.

Figure 2:
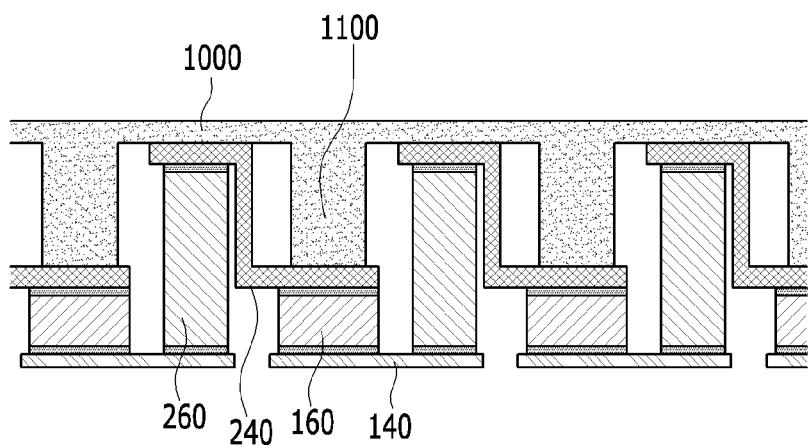
FIG. 2 is a cross-sectional view that is provided for description of a pressure process in element bonding in the exemplary embodiment of FIG. 1.

FIG. 2 is a cross-sectional view that is provided for description of a pressure process in element bonding in the exemplary embodiment of FIG. 1.

Referring to FIG. 2, as previously described, there is a difficulty in bonding between a thermoelectric element and an electrode in manufacturing of the thermoelectric module according to the exemplary embodiment of the present invention due to a height difference between the P-type thermoelectric element 160 and the N-type thermoelectric element 260. In order to solve such a problem, as shown in FIG. 2, a mold 1000 having a plurality of protrusions 1100 that protrude in one direction is used to carry out a high-temperature pressure process in the manufacturing of the thermoelectric module according to the present exemplary embodiment. Here, the mold 1000 may have the plurality of protrusions 1100 to correspond to the P-type thermoelectric element 160 having a low height, and the protrusions 1100 may directly press the second electrode layer 240 that is disposed on the upper end surface of the P-type thermoelectric element 160 during the high-temperature pressure process.

Figure 3A:
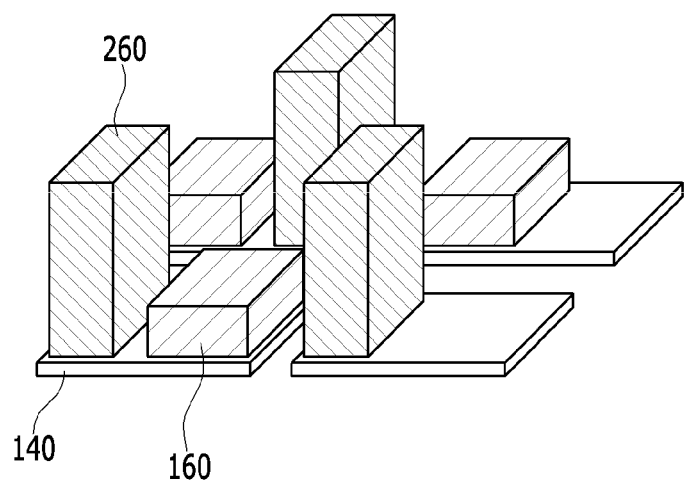
FIG. 3a and FIG. 3b are perspective views of an electrode structure in the thermoelectric module according to the exemplary embodiment of FIG. 1.
Figure 3B:
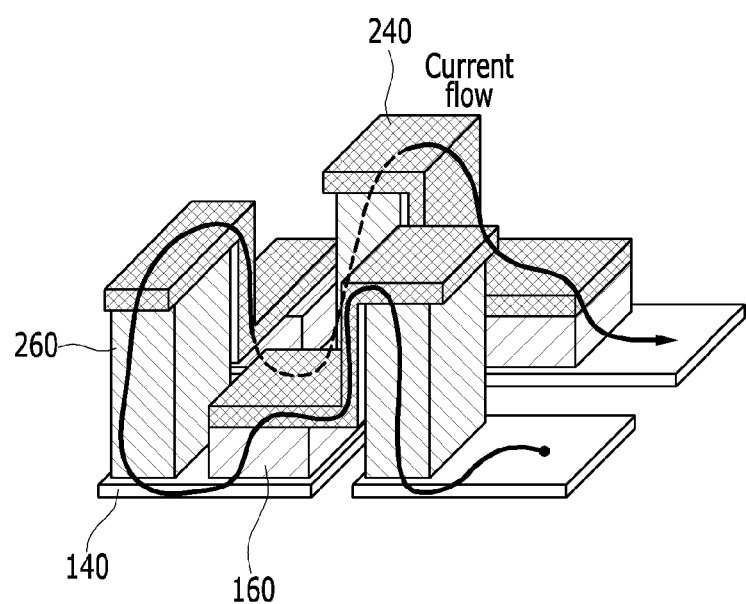

FIGS. 3a and 3b are perspective views of an electrode structure in the thermoelectric module according to the exemplary embodiment of FIG. 1. FIG. 3a shows a state in which the thermoelectric elements 160 and 260 are mounted on the first electrode layer 140, and FIG. 3b is a perspective view that illustrates a state in which the second electrode layer 240 is formed on the mounted thermoelectric elements 160 and 260.

Referring to FIG. 3a and FIG. 3b, an exemplary structure in which a basic unit formed by pairing an N-type thermoelectric element 260 and a P-type thermoelectric element 160 is provided in plural such that the basic units are connected with each other is illustrated. A current may be generated and flow as shown by the arrows in FIG. 3b. A connection structure of the thermoelectric elements 160 and 260 shown in FIG. 3a and FIG. 3b is an example, and the connection structure of the basic units can be variously modified.

Figure 4:
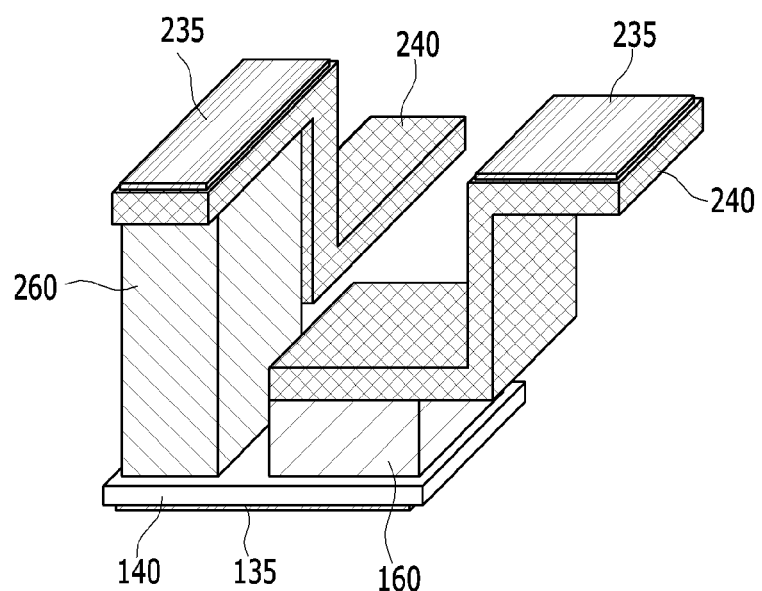
FIG. 4 is a perspective view of an insulation coating layer included in a thermoelectric module according to another exemplary embodiment of the present invention.

FIG. 4 is a perspective view of an insulation coating layer included in a thermoelectric module according to another exemplary embodiment of the present invention.

Referring to FIG. 4, insulation coating layers 135 and 235 are formed on a first electrode layer 140 and a second electrode layer 240 to replace the first substrate 110 and the second substrate 210, which have been described with reference to FIG. 1. The insulation coating layers 135 and 235 are insulators, and they may suppress formation of a leakage current to a heat source/cooling member at the outside the thermoelectric module.

Figure 5:
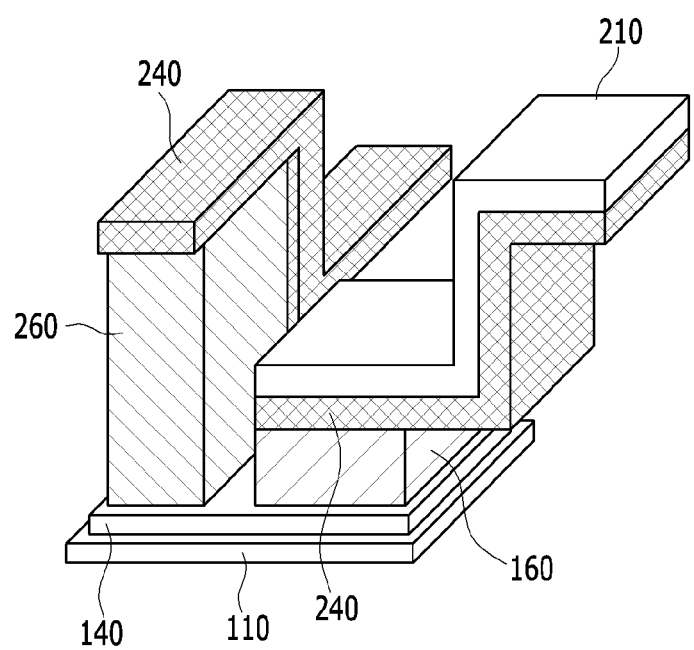
FIG. 5 is a perspective view of an insulation substrate structure included in the thermoelectric module according to the other exemplary embodiment of the present invention.

FIG. 5 is a perspective view of an insulation substrate structure included in the thermoelectric module according to the other exemplary embodiment of the present invention.

Referring to FIG. 5, unlike the second substrate 210 described with reference to FIG. 1, the substrate 210 according to the present exemplary embodiment has a bent structure rather than having a plate shape. That is, the second substrate 210 formed on the second electrode 210 having the bent structure also has two bent portions, and may be closely attached to the second electrode layer 240. Only a portion of the second substrate 210 on the second electrode 240 at the upper end of the P-type thermoelectric element 160 is illustrated in FIG. 5 for convenience of description, but the second substrate 210 may extend and thus the second electrode layer 240 at the upper end of the N-type thermoelectric element 260 may also be covered by the second substrate 210.

Figure 6:
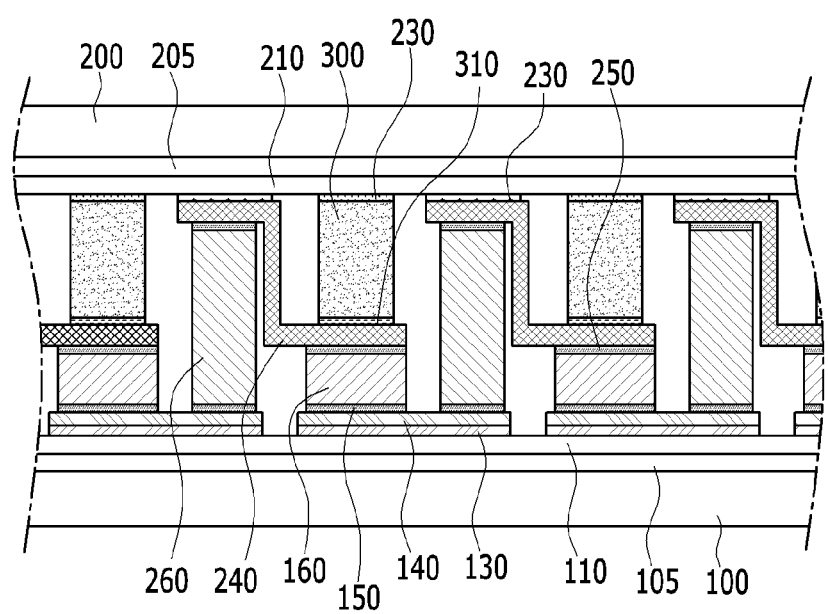
FIG. 6 is a cross-sectional view of a thermoelectric module according to another exemplary embodiment of the present invention.
Figure 7:
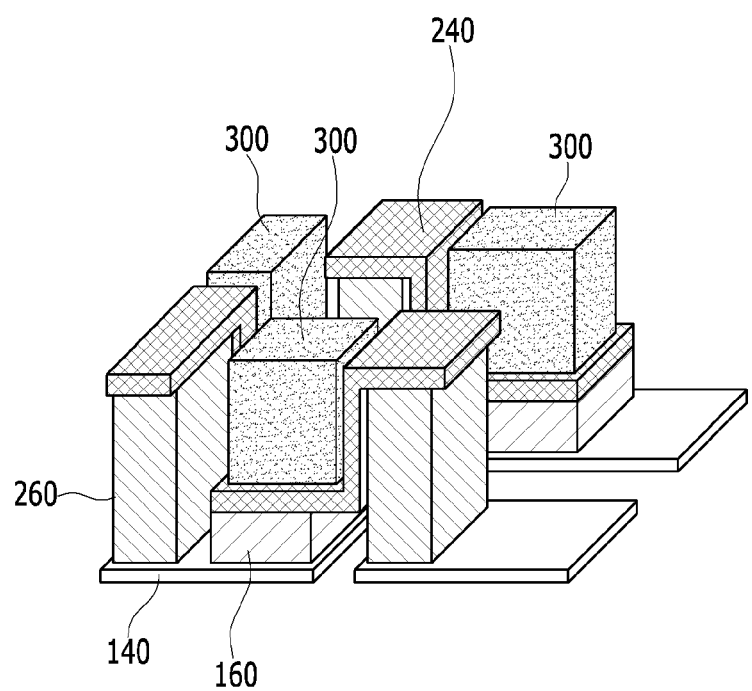
FIG. 7 is a perspective view of an electrode structure in the thermoelectric module according to the exemplary embodiment of FIG. 6.

FIG. 6 is a cross-sectional view of a thermoelectric module according to another exemplary embodiment of the present invention. FIG. 7 is a perspective view of an electrode structure in the thermoelectric module according to the exemplary embodiment of FIG. 6.

FIG. 6 and FIG. 7 are almost the same as the exemplary embodiment described with reference to FIG. 1 and FIG. 3, but a battery module according to the present exemplary embodiment further includes a dummy metal layer 300 that is disposed to overlap a P-type thermoelectric element 160 having a low height, in a perpendicular direction. The dummy metal layer 300 may be disposed between a second substrate 210 and a second electrode layer 240. An adhesive layer 310 may be formed between the dummy metal layer 300 and the second electrode layer 240. The adhesive layer 310 is provided for bonding the dummy metal layer 300 to the second electrode layer 240, and may be formed by using a metal material such as Pb, Al, Ni, Sn, Cu, Ti, Mo, Al, Ag, and an alloy thereof.

The dummy metal layer 300 may be formed in the same number as the number of P-type thermoelectric elements 160 or less than the number of P-type thermoelectric elements 160. Low resistance and a high temperature difference are required for maximizing an output, but when the dummy metal layer 300 is used, the dummy metal layer 300 is not inserted into an electric circuit having a bent electrode structure and thus a heat flow path for transmission of heat from a heat source is added even though total resistance is not changed compared to a case of not using the dummy metal layer 300. Thus, compared to the case of not using the dummy metal layer 300, the output can be maximized by increasing a temperature difference while maintaining the total resistance, which has been minimized.

Figure 8:
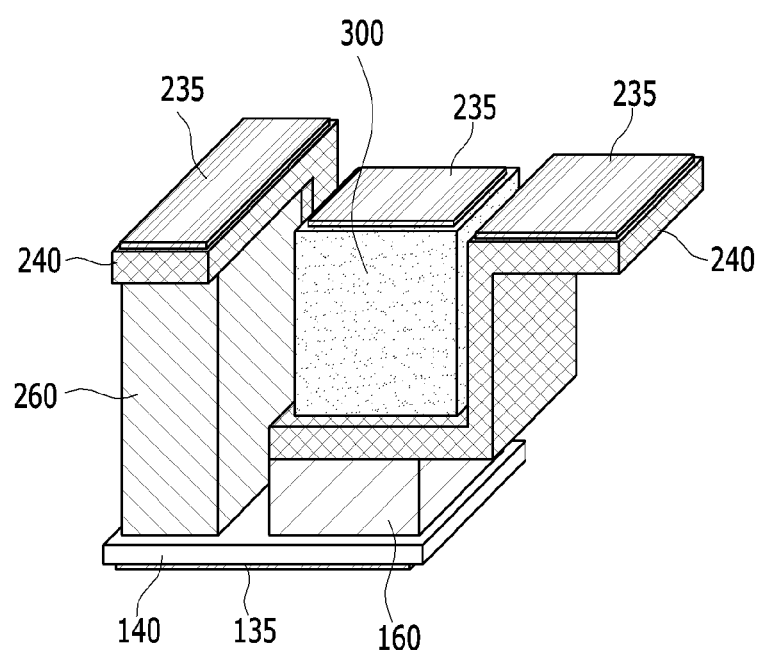
FIG. 8 is a perspective view of an insulation coating layer included in a thermoelectric module according to another exemplary embodiment of the present invention.

FIG. 8 is a perspective view of an insulation coating layer included in a thermoelectric module according to another exemplary embodiment of the present invention.

Referring to FIG. 8, an insulation coating layer 135 and an insulation coating layer 235 are formed on a first electrode layer 140 and a second electrode layer 240, respectively, to thereby replace the first substrate 110 and the second substrate 210 described with reference to FIG. 1. Here, the insulation coating layer 235 may also be formed on a dummy metal layer 300. The insulation coating layer 235 may be an insulator.

Figure 9:
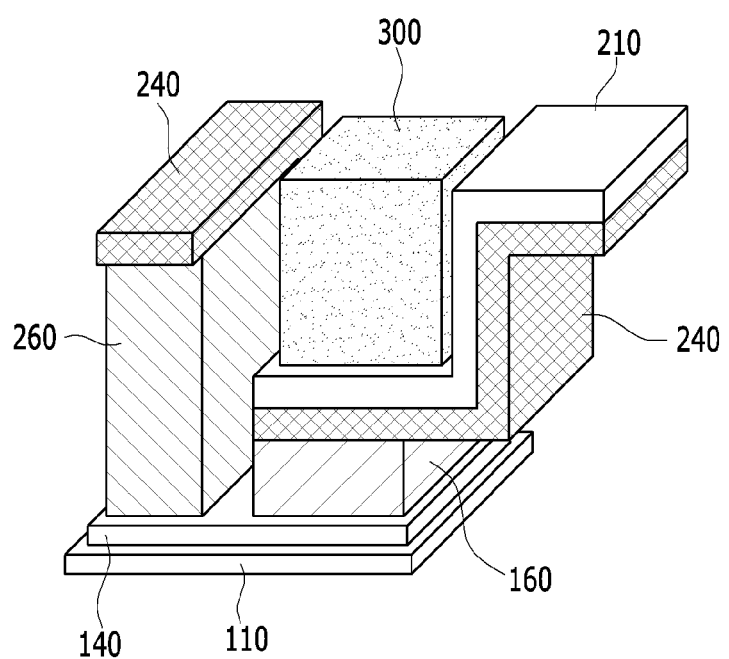
FIG. 9 is a perspective view of a dummy metal layer and an insulation substrate structure included in a thermoelectric module according to another exemplary embodiment of the present invention.

FIG. 9 is a perspective view of a dummy metal layer and an insulation substrate structure included in a thermoelectric module according to another exemplary embodiment of the present invention.

Referring to FIG. 9, unlike the second substrate 210 described with reference to FIG. 1, a second substrate 210 according to the present exemplary embodiment has a bent structure rather than having a plate shape. That is, the second substrate 210 formed on a second electrode layer 240 having a bent structure also has two bent portions such that the second substrate 210 can be closely attached to the second electrode layer 240. In this case, a dummy metal layer 300 may be formed on the second substrate 210.

Figure 10:
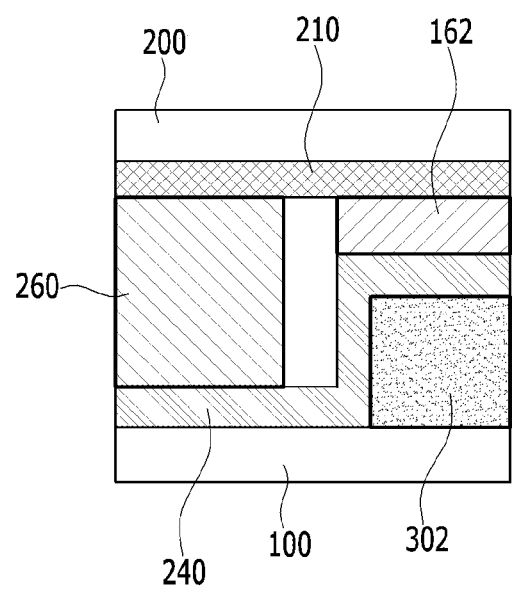
FIG. 10 is a cross-sectional view of a dummy metal layer included in a thermoelectric module according to another exemplary embodiment of the present invention.
Figure 11:
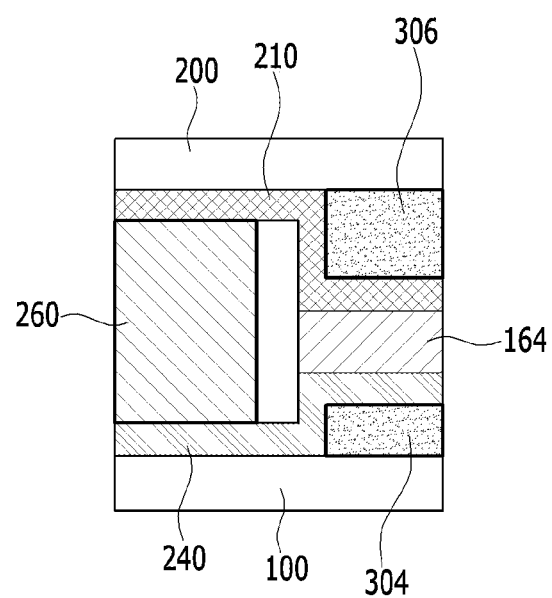
FIG. 11 is a cross-sectional view of upper and lower dummy metal layers included in a thermoelectric module according to another exemplary embodiment of the present invention.

FIG. 10 is a cross-sectional view of a dummy metal layer included in a thermoelectric module according to another exemplary embodiment of the present invention. FIG. 11 is a cross-sectional view of upper and lower dummy metal layers included in a thermoelectric module according to another exemplary embodiment of the present invention.

FIG. 10 is an exemplary variation of FIG. 6, and unlike the exemplary embodiment shown in FIG. 6, a dummy metal layer 302 according to the exemplary embodiment of FIG. 10 is disposed close to a heat transmission member 100 rather than to a P-type thermoelectric element 162.

FIG. 11 is an exemplary variation of FIG. 10, and a dummy metal layer of the exemplary embodiment of FIG. 11 includes an upper dummy metal layer 306 and a lower dummy metal layer 304, and a P-type thermoelectric element 164 having a low height is disposed between the upper dummy metal layer 306 and the lower dummy metal layer 304.

The structures of the exemplary embodiments described with reference to FIG. 10 and FIG. 11 can be induced according to the types of dummy metal layers, and even though it is not illustrated in the present drawing, types of bonding materials, matching of thermal expansion coefficients with neighboring components, bonding strength and bonding properties, and thermal stability of other components except thermoelectric materials.

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

100: heat transmission member
140: first electrode layer
240: second electrode layer
160, 162, 164: P-type thermoelectric element
260: N-type thermoelectric element
200: cooling member
300, 302: dummy metal layer

The invention claimed is:

1. A thermoelectric module comprising:
a heat transmission member;
a cooling member;
a plurality of thermoelectric elements, wherein the plurality of thermoelectric elements is disposed between the heat transmission member and the cooling member;
a plurality of first electrode layers, wherein each first electrode layer is disposed between the heat transmission member and the plurality of thermoelectric elements; and
a plurality of second electrode layers, wherein each second electrode layer is disposed between the cooling member and the plurality of thermoelectric elements,
wherein the plurality of thermoelectric elements comprises a plurality of P-type thermoelectric elements and a plurality of N-type thermoelectric elements,
wherein each P-type thermoelectric element is directly adjacent to a respective N-type thermoelectric element,
wherein each P-type thermoelectric element has a same height in a vertical direction,
wherein each N-type thermoelectric element has a same height in the vertical direction,
wherein the height of each P-type thermoelectric element is different than the height of each N-type thermoelectric element,
wherein each second electrode layer has at least two bent portions extending perpendicular to one another to form an L shape and extends from a top surface of a respective P-type thermoelectric element and to a top surface of a respective N-type thermoelectric element, wherein each second electrode layer has a uniform thickness, wherein the thermoelectric module further comprises a plurality of dummy metal layers, wherein each dummy metal layer is between each P-type thermoelectric element and the cooling member, and wherein each dummy metal layer does not electrically connect the respective P-type thermoelectric element to the respective N-type thermoelectric element.

2. The thermoelectric module of claim 1,
wherein each first electrode layer extends in a single plane, and
wherein each first electrode layer is formed on a bottom surface of the respective N-type thermoelectric element and on a bottom surface of the respective P-type thermoelectric element.

3. The thermoelectric module of claim 1, wherein the height of each P-type thermoelectric element is lower than the height of each N-type thermoelectric element.

4. The thermoelectric module of claim 1, further comprising:
- a first substrate attached to a bottom surface of the plurality of P-type thermoelectric elements; and
- a second substrate attached to a top surface of the plurality of N-type thermoelectric elements,
- wherein the first substrate is disposed outside the plurality of thermoelectric elements at a first side of the plurality of thermoelectric elements, and
- wherein the second substrate is disposed outside the plurality of thermoelectric elements at a second side of the plurality of thermoelectric elements, the first side of the plurality of thermoelectric elements being opposite to the second side of the plurality of thermoelectric elements.

5. The thermoelectric module of claim 4, wherein at least one of the first substrate and the second substrate comprises alumina.

6. The thermoelectric module of claim 3, wherein each P-type thermoelectric element has a length in a horizontal direction different than a length in the horizontal direction of each N-type thermoelectric element, the horizontal direction being perpendicular to the vertical direction.

7. The thermoelectric module of claim 6, wherein the length of each P-type thermoelectric element is longer than the length of each N-type thermoelectric element.

8. The thermoelectric module of claim 1, further comprising a plurality of insulators, wherein each insulator is bonded to an upper surface of a respective N-type thermoelectric element.

9. The thermoelectric module of claim 1, further comprising a plurality of insulators,
- wherein a first group of insulators among the plurality of insulators is bonded to an upper surface of a respective N-type thermoelectric element, and
- wherein a second group of insulators among the plurality of insulators is bonded to an upper surface of a respective dummy metal layer.

\* \* \* \* \*